United States Patent
Chen

(10) Patent No.: US 9,572,290 B2
(45) Date of Patent: Feb. 14, 2017

(54) MODULAR DATA CENTER

(71) Applicant: Alibaba Group Holding Limited, Grand Cayman (KY)

(72) Inventor: Yanchang Chen, Hangzhou (CN)

(73) Assignee: Alibaba Group Holding Limited, Grand Cayman (KY)

( * ) Notice: Subject to any disclaimer, the term of this patent is extended or adjusted under 35 U.S.C. 154(b) by 0 days.

(21) Appl. No.: 14/800,464

(22) Filed: Jul. 15, 2015

(65) Prior Publication Data
US 2016/0021793 A1    Jan. 21, 2016

(30) Foreign Application Priority Data

Jul. 16, 2014    (CN) .......................... 2014 1 0339826

(51) Int. Cl.
*H05K 7/20* (2006.01)
*H05K 7/14* (2006.01)

(52) U.S. Cl.
CPC ......... *H05K 7/20827* (2013.01); *H05K 7/1497* (2013.01)

(58) Field of Classification Search
CPC .......... H05K 7/14; H05K 7/20; H05K 7/1492; H05K 7/1497; H05K 7/20745; H05K 7/208274
USPC ................ 361/679, 470, 690, 691, 695, 724
See application file for complete search history.

(56) References Cited

U.S. PATENT DOCUMENTS

| | | | |
|---|---|---|---|
| 7,259,963 B2 * | 8/2007 | Germagian | H05K 7/20745 361/690 |
| 8,077,457 B2 | 12/2011 | Gauthier et al. | |
| 8,266,921 B2 | 9/2012 | Tashiro | |
| 8,514,572 B2 | 8/2013 | Rogers | |
| 2008/0030078 A1 | 2/2008 | Whitted et al. | |
| 2008/0236070 A1 | 10/2008 | Serinet | |

(Continued)

FOREIGN PATENT DOCUMENTS

WO    WO2011051655    5/2011

OTHER PUBLICATIONS

PCT Search Report and Written Opinion mailed Sep. 7, 2015 for PCT Application No. PCT/US15/40623, 13 pages.

(Continued)

*Primary Examiner* — Xiaoliang Chen
(74) *Attorney, Agent, or Firm* — Lee & Hayes, PLLC

(57) ABSTRACT

A modular data center includes a plurality of first containers and a plurality of second containers. The plurality of first containers and second containers are partitioned into a plurality of functional modules respectively, the functional modules of the plurality of first containers being arranged in parallel, and the functional modules of the plurality of second containers being arranged in parallel on one side of the plurality of first containers and corresponding to the functional modules of the plurality of first containers respectively. The present disclosure combines the functional modules of the plurality of first containers and the plurality of second containers into modular data centers with different forms, capacities, and data center usability tiers, and the assembly of the plurality of first containers and second containers with standardized sizes may facilitate the transportation and reduce the time and cost of assembling and delivery of the modular data center.

14 Claims, 15 Drawing Sheets

(56) References Cited

U.S. PATENT DOCUMENTS

| | | | |
|---|---|---|---|
| 2011/0307102 A1* | 12/2011 | Czamara | H05K 7/1497 |
| | | | 700/277 |
| 2012/0006507 A1* | 1/2012 | Su | H05K 7/20754 |
| | | | 165/80.2 |
| 2012/0055012 A1 | 3/2012 | Gauthier et al. | |
| 2012/0200206 A1 | 8/2012 | Schmitt et al. | |
| 2012/0200987 A1 | 8/2012 | Schmitt et al. | |
| 2014/0036452 A1* | 2/2014 | Peterson | H05K 7/1492 |
| | | | 361/724 |
| 2014/0038510 A1* | 2/2014 | Bailey | H05K 7/20745 |
| | | | 454/339 |
| 2014/0343745 A1* | 11/2014 | Slessman | B31B 43/00 |
| | | | 700/297 |
| 2014/0359998 A1* | 12/2014 | Zwinkels | A47B 81/00 |
| | | | 29/428 |
| 2016/0057894 A1* | 2/2016 | Chen | H05K 7/20745 |
| | | | 361/679.47 |

OTHER PUBLICATIONS

Huawei Technologies Co., Ltd., "Huawei IDS1000 Container Data Center Solutions," 2012, 4 pages.

Schneider Electric, "Prefabricated Module Data Center," Schneider Electric, Data Center Solutions, Oct. 2013, 30 pages.

* cited by examiner

MODULAR DATA CENTER

CROSS-REFERENCE TO RELATED PATENT APPLICATION

This application claims foreign priority to Chinese Patent Application No. 201410339826.0 filed on 16 Jul. 2014, entitled "Modular Data Center," which is hereby incorporated by reference in its entirety.

TECHNICAL FIELD

The present disclosure relates to the technical field of data centers, and, more particularly, to a modular data center.

BACKGROUND

Internet service providers, enterprise users, research institutes, and the like, have a high demand for computers, and a working platform that carries the demands for storage, computation, and network is a data center. The data center is equipped with relevant computer devices, and these devices need a large amount of electrical power and corresponding physical spaces for accommodating mechanical and electrical devices as well as other ICT (Information Communication Technology) related devices, e.g., electronic computers, information processing devices, communication devices, and so on. The data center includes lots of heat generating components, including a variety of AC, DC power sources, CPUs, chip circuits, and so on. Generally, the heat generated by a server may be 250-350 W, and the power consumption of a rack loaded with servers may be up to 8-10 kW, so that the power consumption is enormous.

The implementation of the data center includes two parts, building and machinery & electronics. A whole delivery process encompasses procedures such as consultation, design, bidding, building construction, mechanical and electrical device installation, and system debugging. Normally, it takes roughly one year and a half to build a 1000 $m^2$ data center on leveled land. In some cases, if there is a need for increasing the load capacity of the machinery & electronics and the data center at a certain position of the finished data center, it may probably take several more months to implement, and most of the time is spent on the design and construction, such as the laying of pipelines, cables, racks, cooling system, installation and debugging of relevant devices, and acceptance.

Therefore, current data centers are challenged by the fact that the design of each data center takes a long time and standardize the process throughout the construction to the mechanical and electrical design is difficult. Although a quick deployment may be implemented by using a container-type data center, in most design cases, it is still necessary to arrange maintenance of door opening on the body of the container. Therefore, in general, a distance between each or several containers of the same type will be increased, which results in the problems with large coverage area, a long connection distance of pipelines between the container modules, and increased on-site work load and costs.

In addition, the current container-type data center usually adopts a simple design and technique, which is difficult to be compatible with different distribution architectures. In general, a 40 ft container installed with an electrical power device only and integrated with corresponding input and output distribution, UPS, transformer, and so on, merely provides a power of 500 kW at the maximum. Moreover, in terms of the maintenance space for a large-scale electrical device, it is difficult to implement a large-capacity cluster deployment for the container. Meanwhile, each data center unit of the container-type data center needs to be physically isolated, and each data center has a physical distance from each other data centers, and it is difficult to implement a stacked layout of the refrigeration chilled water host, so that the plane layout occupies a large area. Moreover, in case of a large-scale data center layout, the distance between the modules and the data center is increased, which makes the area occupied by the data center too large and not cost effective.

SUMMARY

This Summary is provided to introduce a selection of concepts in a simplified form that are further described below in the Detailed Description. This Summary is not intended to identify all key features or essential features of the claimed subject matter, nor is it intended to be used alone as an aid in determining the scope of the claimed subject matter. The term "technique(s) or technical solution(s)" for instance, may refer to apparatus(s), system(s), method(s) and/or computer-readable instructions as permitted by the context above and throughout the present disclosure.

The technical problem to be solved by the present disclosure is to provide a data center, wherein, by partitioning a plurality of first containers and a plurality of second containers into different functional modules respectively and by combining the functional modules, the modular data center is capable to implement a quick capacity expansion or change of data center usability tiers according to the use requirement, and the interior space of the modular data center is effectively used via the inter-communication among different functional modules after the combination, which thus solves the technical problems of slow construction speed, difficulty in capacity expansion, and overly large site area in terms of the data center.

To solve the above problem, the present disclosure discloses a modular data center, which includes a plurality of first containers and a plurality of second containers, wherein the plurality of first containers are partitioned into a plurality of information technology device modules, a plurality of space maintenance modules, and at least one distribution module, and the plurality of information technology device modules, the plurality of space maintenance modules, and the distribution module are arranged in parallel in a width direction of the first containers. For example, the arrangement herein may refer to a placement or an installation of the containers. The width of the second containers is identical to or substantially the same as those of the first containers, and a length of the second containers are smaller than those the first containers. The plurality of second containers are partitioned into a plurality of power supply modules, a plurality of fire-fighting modules, and at least one passage module, which are arranged in parallel in the width direction of the first containers on one side of the plurality of first containers respectively, and in the length direction of the first containers, the plurality of power supply modules correspond to the plurality of information technology device modules respectively, the plurality of fire-fighting modules correspond to the plurality of space maintenance modules respectively, and the passage module corresponds to the distribution module. The interior spaces of the plurality of information technology device modules are connected with those of the plurality of space maintenance modules, and an air inlet and an air outlet are arranged between the information technology device modules and the distribution module. The information technology device modules are connected with the distribution module through the air inlet and the air outlet.

The present disclosure further discloses a modular data center, which includes a plurality of first containers and a plurality of second containers. The plurality of first containers are partitioned into a plurality of information technology device modules, a plurality of space maintenance modules, and at least one distribution module, and the plurality of information technology device modules, the plurality of space maintenance modules, and the distribution module are arranged in parallel in a width direction of the first containers, wherein the plurality of information technology device modules, the plurality of space maintenance modules, and the distribution module, which are arranged in parallel, form a data center unit. In the plurality of first containers, a plurality of data center units is formed in accordance with the quantity of the plurality of first containers. The width of the second containers is identical to or substantially the same as that of the first containers, and the length of the second containers is smaller than that of the first containers. The plurality of second containers are partitioned into a plurality of passage modules, and the plurality of passage modules are arranged in parallel in the width direction of the first containers among the plurality of data center units, and corresponds to the plurality of first containers respectively in the length direction of the first containers. The interior spaces of the plurality of passages are connected to form a maintenance passage among the plurality of data center units, and the maintenance passage is also connected with the interior spaces of the plurality of information technology device modules, the plurality of space maintenance modules, and the distribution module respectively.

Compared with conventional techniques, the present disclosure may acquire the following technical advantages.

By assembling the standardized first containers and second containers with different lengths into prefabricated functional modules of different types and capacities, a simple on-site combination of the overall architecture of the modular data center may be implemented to improve the construction speed of the modular data center. Moreover, partitioning the first containers into the space maintenance modules and partitioning the second containers into the fire-fighting module and the passage module may solve the problems with maintenance of a large capacity mechanical and electrical system, fire compartment, and a maintenance passage at the same time. In the meantime, the arrangement of sharing a space maintenance module and a passage module in the modular data center supports a transverse capacity expansion of the modular data center after the combination and reduces the occupied area. At the same time, different functional modules as partitioned in the plurality of first containers and the plurality of second containers also support a vertical deployment mode as well, which further reduces the area occupied by the modular data center. Based on the above description, the modular data center of the present disclosure may achieve the flexibility in changing capacities, data center usability tiers, and quantity of the server cabinets as well as stacking or transverse connection.

Furthermore, the plurality of first containers and the plurality of second containers in the present disclosure are partitioned into a variety of functional modules formed by different electrical, refrigeration, fire-fighting technique, and information technology devices, so that the modular data center of the present disclosure may be further compatible with different distribution solutions and refrigeration techniques.

BRIEF DESCRIPTION OF THE DRAWINGS

The accompanying drawings described herein are used to provide a further understanding of the present disclosure and constitute a part of the present disclosure. The example embodiments and the description thereof in the present disclosure are used to explain the present disclosure and do not constitute an improper limit on the scope of the present disclosure. In the drawings.

DETAILED DESCRIPTION

Figure 1:
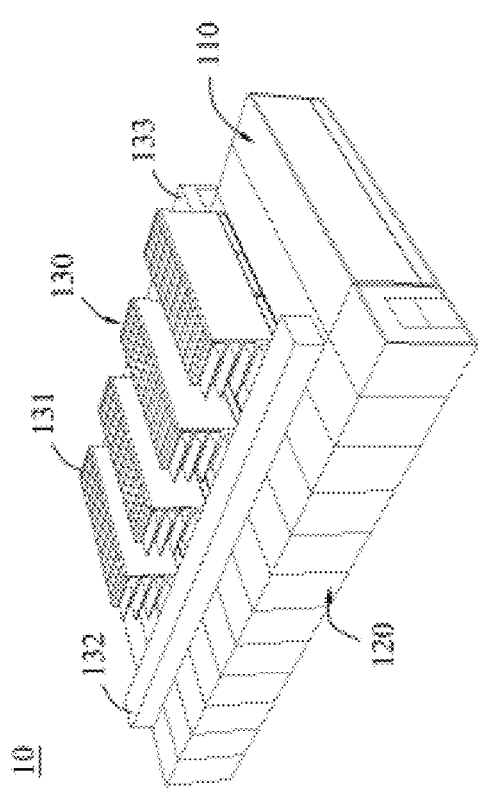
FIG. 1 is a schematic perspective view of a modular data center according to a first example embodiment of the present disclosure.

The implementation of the present disclosure will be set forth in detail in the following with reference to the accompanying drawings and the example embodiments, so that the implementation process of how the present disclosure uses the techniques to solve the technical problem and achieve the technical effect may be understood and implemented accordingly.

Certain terms are used throughout the following description and claims, which refer to particular components. As one skilled in the art will appreciate that hardware manufacturers may refer to the same component by different names. The specification and the claims do not intend to distinguish components that differ in name but not in function. Instead, the specification and the claims distinguish components based on their functionalities. As mentioned throughout the specification and claims, the term "including" or "comprising" or their variations are used as an open-ended term, and thus should be interpreted to mean "including, but not limited to." The term "substantially" or its variation refers to in an acceptable error range, and those skilled in the art are capable to solve the technical problem and substantially achieve the technical effect in a certain error range. Moreover, the terms "couple" and "electrically connect" herein include either a direct or an indirect electrical coupling technique. Thus, if a first apparatus couples to a second apparatus herein, it indicates that the first apparatus may couple to the second apparatus through a direct electrical coupling, or through an indirect electrical coupling via other apparatus and coupling techniques. The example embodiments for implementing the present disclosure are described in the specification in the following, but the description is still only for the purpose of explaining the general principle of the present disclosure and is not intended to limit the scope of the present disclosure. The protection scope of the present disclosure shall be based on the claims of the present disclosure.

It should be noted that the term "including," "comprising," or any variation thereof refers to non-exclusive inclusion so that a process, method, product, or device that includes a plurality of elements does not only include the plurality of elements but also any other element that is not expressly listed, or any element that is essential or inherent for such process, method, product, or device. Without more restriction, the elements defined by the phrase "including a . . . " does not exclude that the process, method, product, or device includes another same element in addition to the elements.

Description of the Embodiments

As shown in FIG. 1 to FIG. 5, the modular data center 10 disclosed in the first example embodiment of the present disclosure includes a plurality of first containers 110, a plurality of second containers 120, and a refrigeration unit 130.

The first containers 110 and the second containers 120 may be, but are not limited to, standard containers or steel frames having the same size. In the example embodiment, the first containers 110 and the second containers 120, which are standard containers of different sizes, are used as an example, wherein the first containers 110 and the second containers 120 have the same or substantially the same width, and the length of the first containers 110 is greater than that of the second containers 120. For example, the first containers 110 are 40 ft standard containers, while the second containers 120 are 10 ft standard containers, and the length of the first containers 110 is multiple times of that of the second containers 120.

Figure 6A:
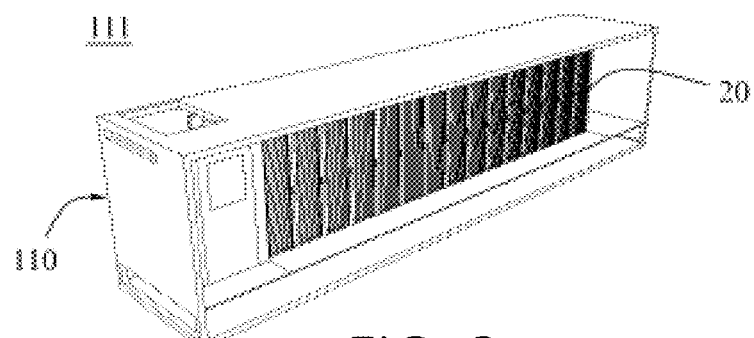
FIG. 6a is a schematic perspective view of an information technology device module of the modular data center according to the first example embodiment of the present disclosure.
Figure 6B:
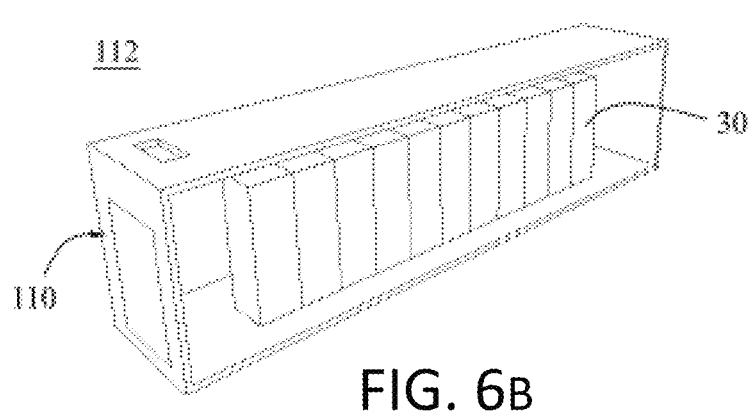
FIG. 6b is a schematic perspective view of a distribution module of the modular data center according to the first example embodiment of the present disclosure.
Figure 6C:
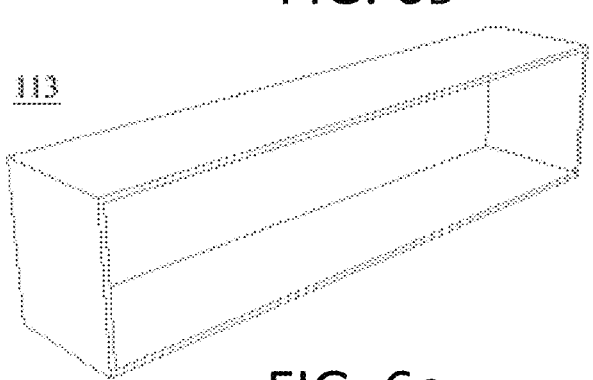
FIG. 6c is a schematic perspective view of a space maintenance module of the modular data center according to the first example embodiment of the present disclosure.

In addition, in the example embodiment, the plurality of first containers 110 and the plurality of second containers 120 are further partitioned into different functional modules according to different apparatuses or devices arranged therein. For example, some first containers 110, in which an IT (information technology) device 20 (for example, a server cabinet) is installed, are partitioned into information technology device modules 111 (as shown in FIG. 6a). Some first containers 110, in which an electrical device 30 such as a transformer, a low-voltage distribution cabinet, a power compensation cabinet, and an ATS (automatic transfer switch) cabinet is installed, are partitioned into a distribution module 112 (as shown in FIG. 6b). Some first containers 110 whose interior spaces are not used are partitioned into a space maintenance module 113 (as shown in FIG. 6c), which are to be used as a maintenance passage of ICT (Information Communication Technology) device or a mechanical and electrical device, an access passage to the modular data center 10 or an isolated passage among different zones, etc.

Figure 4:
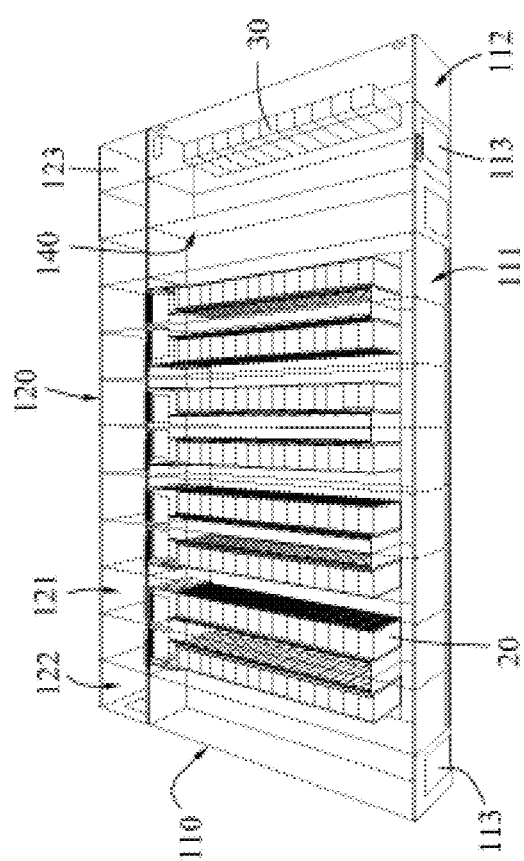
FIG. 4 is a schematic perspective view of the first containers and the second containers which are arranged near each other according to the first example embodiment of the present disclosure from another angle of view.

Therefore, in the example embodiment, the plurality of first containers 110 are partitioned into a plurality of information technology device modules 111, a plurality of space maintenance modules 113, and at least one distribution module 112, wherein the plurality of information technology device modules 111, the plurality of space maintenance modules 113, and the distribution module 112 are arranged in parallel in the width direction of the first containers 110 respectively. For example, the plurality of space maintenance modules 113 are arranged in the width direction on two opposite sides of the plurality of information technology device modules 111 respectively, so that the plurality of information technology device modules 111 are centralized, and the interior spaces of the plurality of information technology device modules 111 are connected with those of the plurality of space maintenance modules 113. The distribution module 112 is arranged on the other side of the space maintenance modules 113 opposite to the information technology device modules 111, so that the space maintenance modules 113 on the same side as the information technology device modules 111 are just located between the distribution module 112 and the information technology device module 111. Moreover, in terms of security, a fire barrier 140 may be further installed inside the first containers 110, for physically isolating the zones where different functional modules are arranged. For example, the fire barrier 140 may be installed between the distribution module 112 and the information technology device modules 111 (as shown in FIG. 4) for isolating the distribution module 112 from the information technology device modules 111.

Figure 7A:
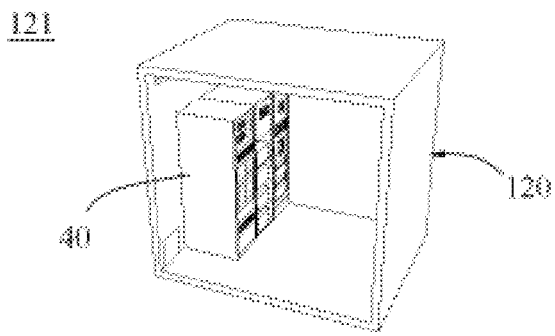
FIG. 7a is a schematic perspective view of a power supply module of the modular data center according to the first example embodiment of the present disclosure.
Figure 7B:
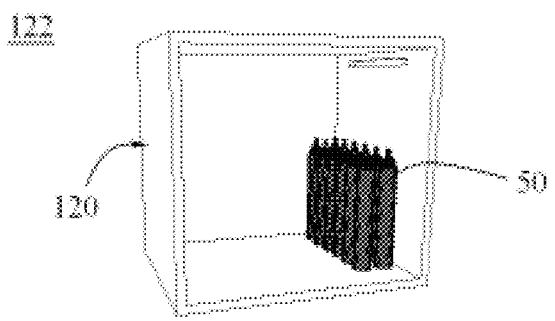
FIG. 7b is a schematic perspective view of a fire-fighting module of the modular data center according to the first example embodiment of the present disclosure.
Figure 7C:
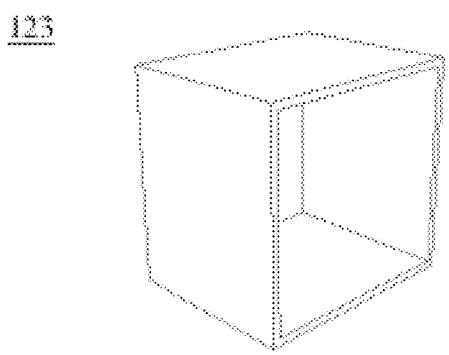
FIG. 7c is a schematic perspective view of a passage module of the modular data center according to the first example embodiment of the present disclosure.

The plurality of second containers 120 are partitioned into a plurality of power supply modules 121, a plurality of fire-fighting modules 122, and at least one passage module 123. The power supply modules 121 are some of the second containers 120, in which a power device 40 such as a UPS (uninterruptible power supply) input and output cabinet, a battery switch, and a battery is installed (as shown in FIG. 7a). The fire-fighting modules 122 are some of the second containers 120, in which a gas fire-fighting device 50 is installed among the plurality of second containers 120 (as shown in FIG. 7b). The passage module 123 are one or more of the second containers 120 whose interior spaces are not used (as shown in FIG. 7c), which is to be used as a maintenance passage of the ICT (Information Communication Technology) device or the mechanical and electrical device, an access passage to the modular data center 10 or an isolated passage among different zones, or the like, and functions similarly as the space maintenance modules 113.

The plurality of second containers 120 are arranged in parallel in the width direction of the first containers 110 on one side of the plurality of first containers 110 respectively, and in a length direction of the first containers 110, the plurality of power supply modules 121 are combined respectively and correspondingly with the plurality of information technology device modules 111. The plurality of fire-fighting modules 122 are combined respectively and correspondingly with the plurality of space maintenance modules 113. The passage module 123 is combined correspondingly with the distribution module 112. For example, the distribution module 112 is capable to support a 2000 kW power distribution capacity, and the power supply module 121 is capable to support a 300-400 kW power distribution capacity, so that the modular data center 10 may provide a distributed power supply through the change in the quantity and arrangement positions of the distribution module 112 and the power supply modules 121, thereby improving the overall power capacity. Moreover, through the coordination of the distribution module 112 and the space maintenance module 113, for example, through the arrangement of a uninterruptible power supply, battery, and the like in an idle space between the distribution module 112 and the space maintenance module 113 that are connected with each other, a centralized power distribution is achieved.

Figure 5:
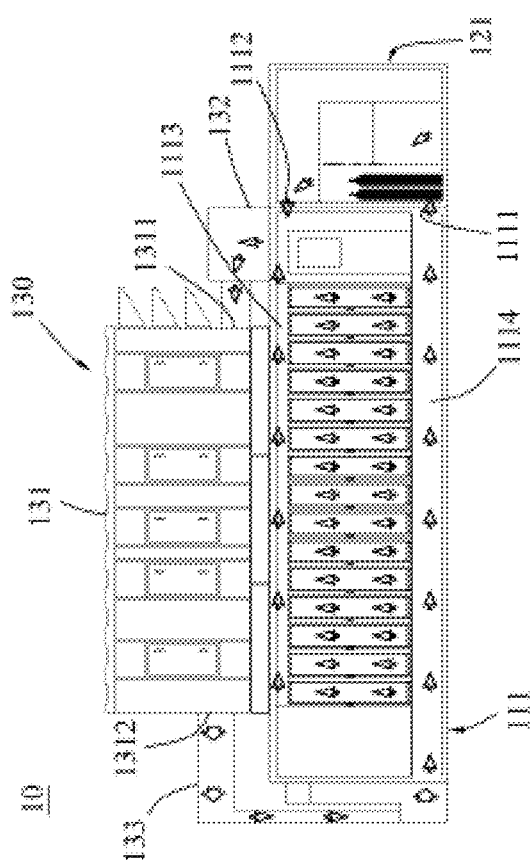
FIG. 5 is a schematic side view of the modular data center according to the first example embodiment of the present disclosure.

As shown in FIG. 5, an air inlet 1111 and an air outlet 1112 are installed between the information technology device modules 111 and the power supply modules 121, and the information technology device modules 111 are further provided with a hot air passage 1113 and a cold air passage 1114. The hot air passage 1113 and the cold air passage 1114 are arranged on the top and bottom of the information technology device modules 111 respectively, and correspond to the air outlet 1112 and the air inlet 1111 respectively, so that the information technology device module 111 is connected with the interior space of the power supply modules 121 through the air inlet 1111 and the air outlet 1112, so that the cold air generated by the refrigeration unit 130, after being transmitted through the cold air passage 1114 (as indicated by the arrow in the cold air passage 1114 as shown FIG. 5), enters the power supply module 121 via the air inlet 1111 and, after the hot air inside the power supply module 121 enters the hot air passage 1113 via the air outlet 1112 (as indicated by the arrow in the air outlet 1112 as shown in FIG. 5), the hot air is transmitted to the refrigeration unit 130 through the hot air passage 1113 for a cooling procedure.

Figure 2:
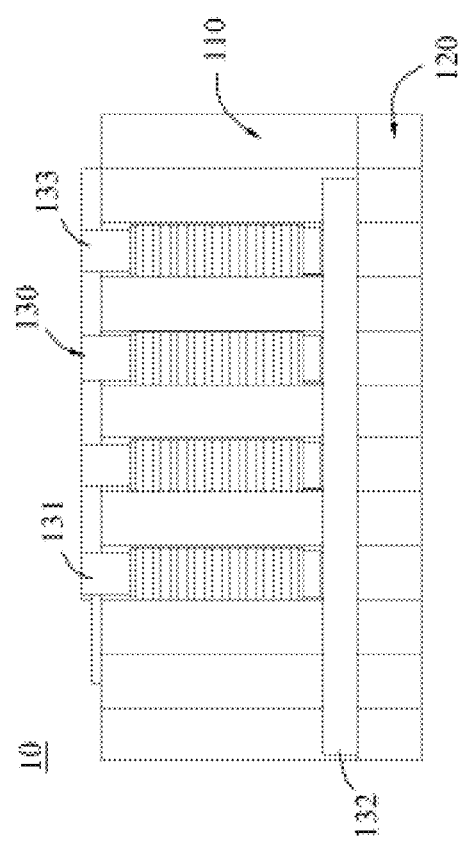
FIG. 2 is a schematic top view of the modular data center according to the first example embodiment of the present disclosure.

Please refer to FIG. 1, FIG. 2, and FIG. 5, the refrigeration unit 130 includes a plurality of refrigeration modules 131, an air return pipe 132, and an air supply pipe 133. The refrigeration modules 131 may be, but is not limited to, an air handling unit (AHU), which is capable to support the air-cooled or chilled water refrigeration technique and, for example, may support heat exchange with a 100-500 kW capacity. The plurality of refrigeration modules 131 are arranged at an interval on the plurality of first containers 110, and correspond to a plurality of information technology device modules 111 respectively. Each refrigeration module 131 includes an air return inlet 1311 and an air vent 1312, wherein one end of the air return pipe 132 is connected to the air return inlet 1311 of the plurality of refrigeration modules 131, and the other end is connected to the hot air passage 1113 of the plurality of information technology device modules 111. One end of the air supply pipe 133 is connected to the air vent 1312 of the plurality of refrigeration modules 131, and the other end is connected to the cold air passage 1114 of the plurality of information technology device modules 111. Thus, the plurality of refrigeration modules 131 supply the cold air into each information technology device module 111 through the air supply pipe 133, and the cold air is transmitted into other modules through the air inlet arranged between the information technology device modules 111 and other modules. Through the hot air passage 1113 of the information technology device modules 111, the hot air generated in the first containers 110 is transmitted to the air return pipe 132, so that the hot air is transmitted into the refrigeration module 131 collectively through the air return pipe 132 for a heat exchange procedure.

It is worth noting that the first containers and the second containers of the modular data center of the present disclosure may both adopt standard containers or steel frames steel frames having the same size, which may acquire a modular data center having different capacities, different data center usability tiers and different server cabinet power densities through a flexible combination of the first containers and the second containers of different quantities and with different functions, and thus the modular data center is not limited to those formed in accordance with the arrangements of the above example embodiments. By flexibly combining the functional modules formed by the first containers and the second containers according to the use requirement, the construction speed of the modular data center may be accelerated through a standardized design and fabrication.

Figure 8:
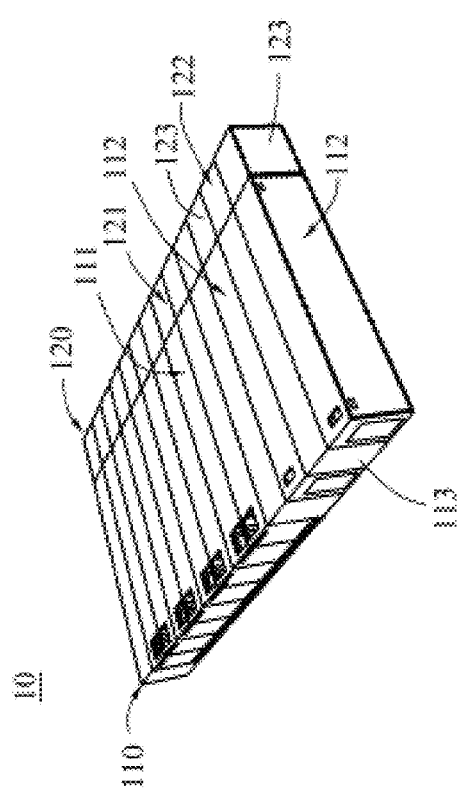
FIG. 8 is a schematic perspective view of the modular data center according to the first example embodiment of the present disclosure after an addition of the distribution module.

As shown in FIG. 8, for example, the distribution module 112 and its corresponding passage module 123 may be added in the existing modular data center 10 to change the data center usability tiers of the modular data center 10. Since the distribution module 112 is one of the first containers 110 in which the electrical devices such as a transformer, a low-voltage distribution cabinet, a power compensation cabinet, and an automatic transfer switch cabinet are pre-integrated, during the assembling, the design of the data center usability tiers may be changed just by arranging the additional distribution module 112 in parallel in position according to the use requirement. In other words, the capacity of the modular data center 10 may be expanded by increasing the quantities of the parallel information technology device modules 111, space maintenance modules 113, or distribution module 112 and the quantities of the corresponding power supply module 121, fire-fighting module 122, or passage module 123 in the width direction of the first containers 110 and the second containers 120, which is a simple operation.

Figure 9:
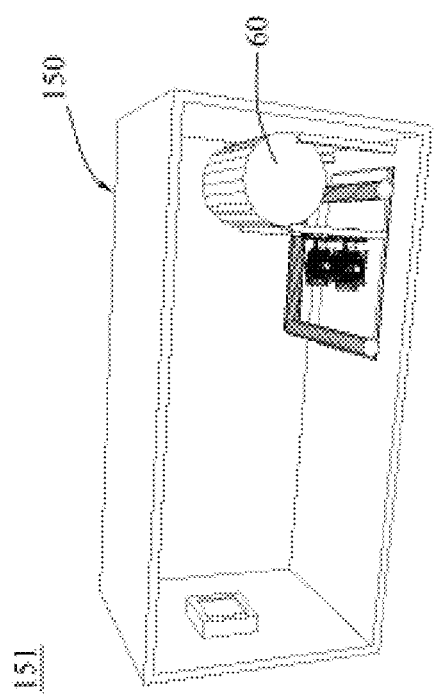
FIG. 9 is a schematic perspective view of a water fire-fighting module of the modular data center according to some example embodiments of the present disclosure.

In addition, in order to improve the convenience and flexibility in the assembling of the modular data center, in some example embodiments of the present disclosure, the modular data center may further includes at least one third container. The third container adopts a standard container or a steel frame having the same size. For example, the width of the third container is identical to or substantially the same as that of the first containers, but the length of the third container is between that of the first containers and that of the second containers, such as a 20 ft standard container. The length of the third container may be equal to the width of the first containers and two times the length of the second containers, so that the third container may replace two second containers in the arrangement, thereby reducing the assembling time of the functional modules. For example, a third container 150 may be a fire-fighting module 151 equipped with a water fire-fighting device 60 (as shown in FIG. 9), and thus may selectively replace two fire-fighting modules provided with a gas fire-fighting device among the plurality of second containers which are arranged in parallel.

Figure 10:
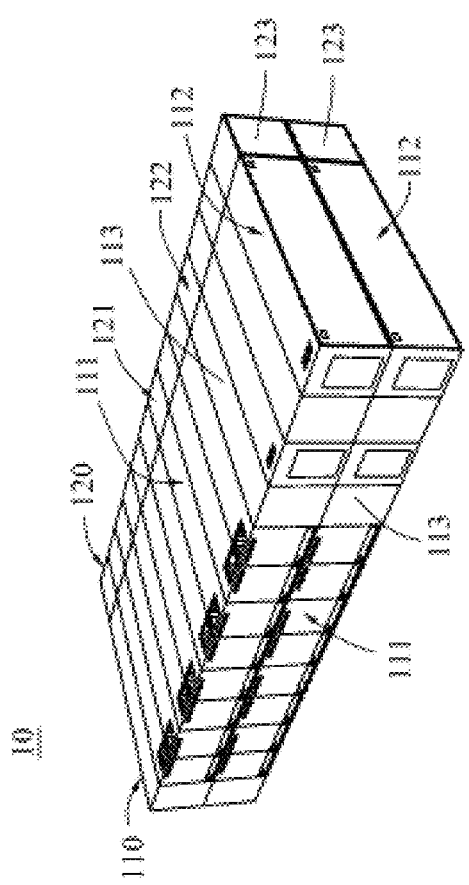
FIG. 10 is a schematic perspective view of the modular data center according to example embodiments of the present disclosure.

As shown in FIG. 10, in addition to expanding the capacity in the width direction, the capacity of the modular data center 10 may further be expanded in the vertical direction by stacking the plurality of first containers 110 and the second containers 120. For example, the plurality of information technology device modules 111, the plurality of space maintenance modules 113, and the distribution module 112 which are arranged in parallel are formed in the plurality of first containers 110, and the plurality of power supply modules 121, the fire-fighting module 122, and the passage module 123 which are arranged in parallel are formed in the plurality of second containers 120. Then the plurality of first containers 110 are stacked in row fashion in the height direction of the first containers 110, and the plurality of second containers 120 are correspondingly arranged on one side of the plurality of first containers 110 by stacking in row fashion and correspond to the first containers 110 respectively. Thus, the capacity of the modular data center 10 is expanded in the vertical direction, which reduces the area occupied by the modular data center 10.

Figure 3:
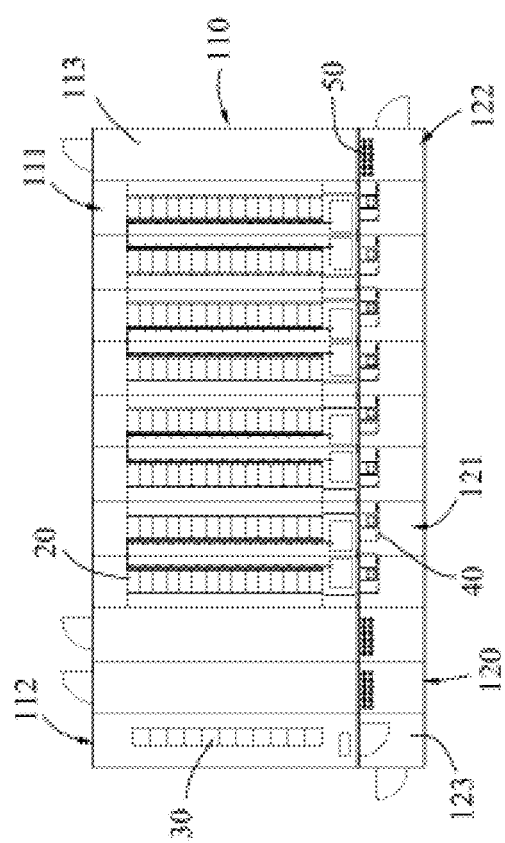
FIG. 3 is a schematic top view of first containers and the second containers which are arranged by each other according to another example embodiment of the present disclosure.

Please refer to FIG. 3 and FIG. 4, additionally, in consideration of the periodic maintenance, the maintenance space modules 113 partitioned in the first containers 110 and the passage module 123 partitioned in the second containers 120 allow operators to access the information technology device modules 111, the distribution module 112, the power supply module 121, or the fire-fighting module 122 through the maintenance space module 113 and the passage module 123 to carry out relevant maintenance operation on the devices. At the same time, one or more surfaces of the modules may accept open design so that each module is connected. In addition, through the arrangement of the fire barrier 140, one or more surfaces of the modules may be isolated from each other, thereby providing a physical isolation for different function zones in the modular data center 10. For example, the interior spaces of the parallel second containers 120 adopt the open design and the interior spaces of the parallel second containers 120 are connected so that in the parallel second containers 120, in addition to the corresponding uninterruptible power supply, battery and fire-fighting device, there is enough space to be used as an operation space for device maintenance and a maintenance passage for operators. Thus the interior space of the modular data center 10 may be effectively utilized, and the area occupied by the modular data center may be further reduced.

Figure 11:
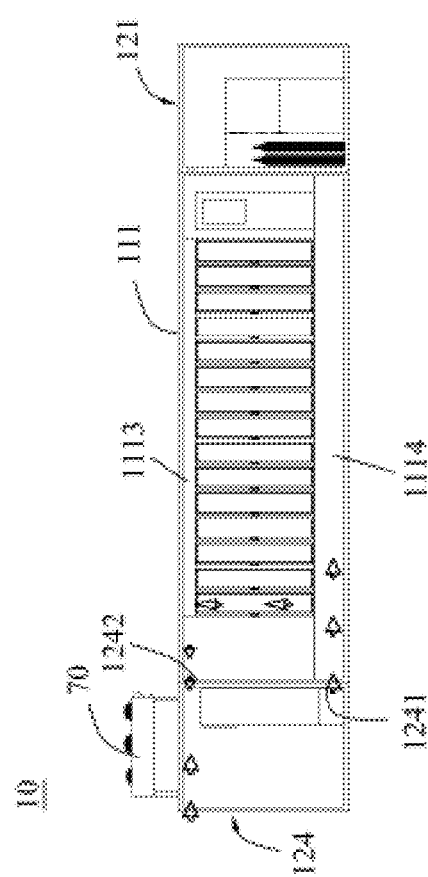
FIG. 11 is schematic side view of a modular data center according to a second example embodiment of the present disclosure.
Figure 12:
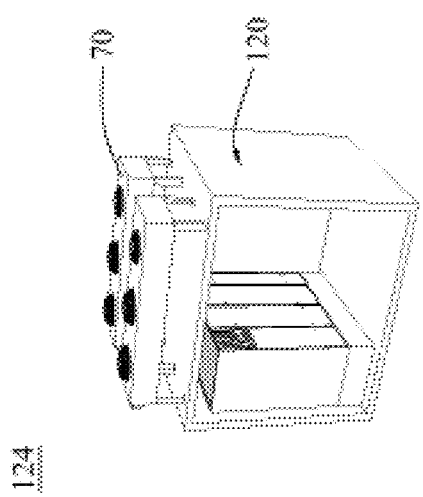
FIG. 12 is a schematic perspective view of a precision air conditioning module of the modular data center according to the second example embodiment of the present disclosure.

As shown in FIG. 11 and FIG. 12, the second example embodiment and the first example embodiment disclosed in the present disclosure are substantially identical in terms of the structure, and they differ in that some of the plurality of second containers 120 of the data center 10 as disclosed in the second example embodiment of the present disclosure are further partitioned into a plurality of precision air conditioning modules 124, so that the arrangement of the refrigeration module may be selectively omitted.

The precision air conditioning modules 124 are some of the second containers 120 equipped with the air-cooled or chilled water type heat exchange device 70, and, for example, are capable to support the heat exchange with a 40-150 kW capacity. The plurality of precision air conditioning modules 124 are arranged in parallel on the other side of the plurality of information technology device modules 111 opposite to the plurality of power supply modules 121, and correspond to the plurality of information technology device modules 111 respectively, so that the precision air conditioning modules 124 and the power supply modules 121 are arranged on two opposite sides of the information technology device modules 111 in the length direction of the information technology device modules 111 respectively. The precision air conditioning modules 124 are equipped with an air vent 1241 and an air return inlet 1242. The air vent 1241 is connected to the cold air passage 1114 of the information technology device modules 111, so that the precision air conditioning modules 124 may supply cold air into the information technology device modules 111 through the air vent 1241. The air return inlet 1242 is connected to the hot air passage 1113 of the information technology device 111, so that the hot air inside the hot air passage 1113 may enter, through the air return inlet 1242, the precision air conditioning modules 124 for a heat exchange. Thus the cold air and the hot air may circulate inside the modular data center 10, and the devices inside the modular data center 10 may operate under an appropriate temperature.

Figure 13:
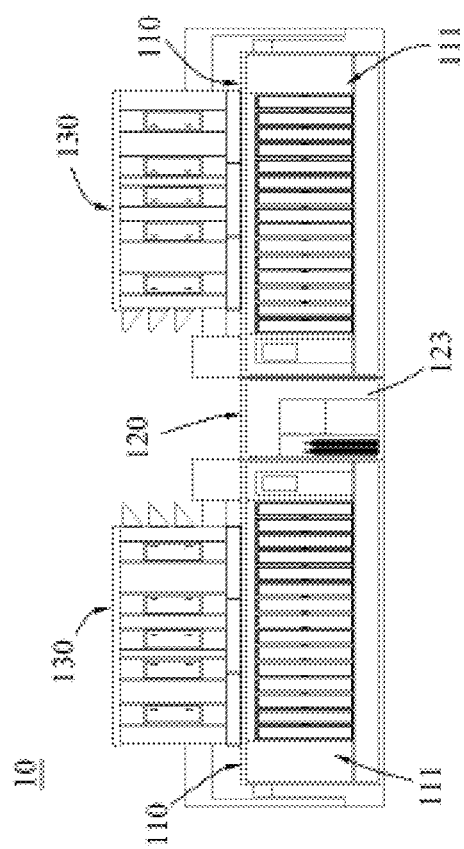
FIG. 13 is a schematic side view of a modular data center according to a third example embodiment of the present disclosure.
Figure 14:
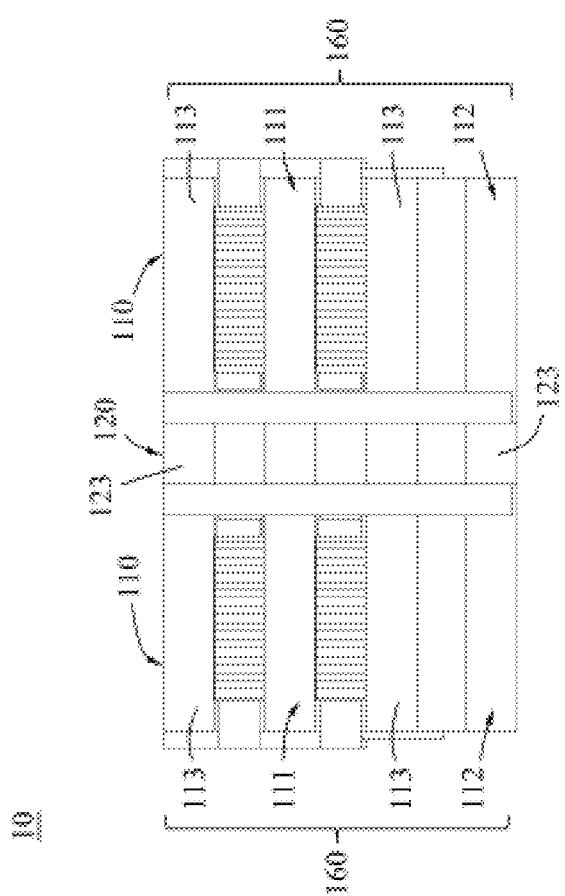
FIG. 14 is a schematic top view of the modular data center according to the third example embodiment of the present disclosure.

As shown in FIG. 13 and FIG. 14, the modular data center 10 as disclosed in the third example embodiment of the present disclosure includes a plurality of first containers 110 and a plurality of second containers 120, and the plurality of first containers 110 are partitioned into a plurality of information technology device modules 111, a plurality of space maintenance modules 113, and at least one distribution module 112, wherein the arrangement of the plurality of information technology device modules 111, the plurality of space maintenance modules 113, and the distribution module 112 is identical to or substantially the same as that in the first example embodiment. The difference lies in that the plurality of information technology device modules 111, the plurality of space maintenance modules 113, and the distribution module 112 which are arranged in parallel in the example embodiment form the data center unit 160, and in the plurality of first containers 110, a plurality of data center units 160 are formed according to the quantity of the first containers 110.

Figure 15:
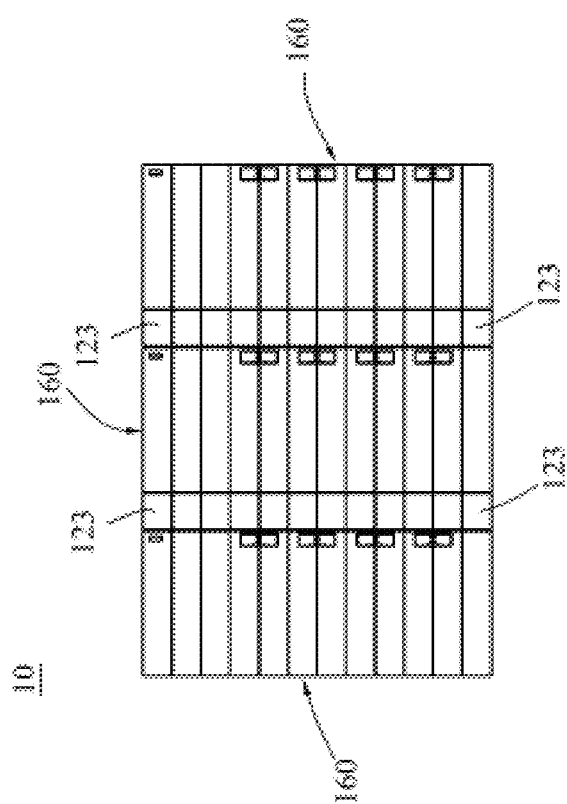
FIG. 15 is a schematic top view of a modular data center according to other embodiments of the present disclosure.

Furthermore, in the example embodiment, the plurality of second containers are partially or totally partitioned into the passage modules 123 for use, and the plurality of passage modules 123 are arranged in parallel in the width direction of the first containers among the plurality of data center units 160 (as shown in FIG. 15), for example between two data center units 160 (as shown in FIG. 13 and FIG. 14), and correspond to the plurality of first containers 110 in the length direction of the first containers 110 respectively. The interior spaces of the plurality of passage modules 123 are connected, thereby forming a maintenance passage between two data center units 160, and the maintenance passage is connected with the interior space of the plurality of information technology device modules 111, the plurality of space maintenance modules 113, and the distribution module 112 respectively. Thus the operators may carry out the maintenance on the relevant devices through the maintenance passage.

Likewise, with respect to the refrigeration mode of the modular data center 10 in the example embodiment, the refrigeration unit 130 may be selectively arranged on each data center unit 160; or some of the second containers 120 may be partitioned into the precision air conditioning modules for a heat exchange, wherein the arrangement of the refrigeration unit and the precision air conditioning modules is identical to or substantially the same as that in the above example embodiment, which will not be repeated.

Based on the above description, the modular data center of the present disclosure adopts standard containers or steel frames having the same size as the first containers and the second containers, and, through the different sizes of the first containers and the second containers and a variety of different functional modules acquired by partitioning the plurality of first containers and the plurality of second containers, the modular data center having different capacities, different data center usability tiers and different server cabinet power densities may be acquired through the combination of the first containers and the second containers of different quantities and with different functions, thereby providing a flexibility in use. In addition to the flexible capacity expansion of the modular data center in the transverse or vertical direction, the area occupied by the modular data center may be reduced.

The above description has shown and described some example embodiments of the present disclosure. However, as previously discussed, it should be understood that the description disclosed herein is not used to limit the present disclosure and should not be considered as an exclusion of other embodiments. The techniques of the present disclosure may be used in various other combinations, modifications, and environments and are capable of being amended within the scope of the invention ideas described herein through the above teachings or technology or knowledge in the related field. Moreover, modifications and variations carried out by those skilled in the art without departing from the spirit and scope of the present disclosure shall fall within the scope of protection of the appended claims of the present disclosure.

What is claimed is:

1. A modular data center, comprising:
a plurality of first containers that are partitioned into a plurality of information technology device modules, a plurality of space maintenance modules, and at least one distribution module, the plurality of information technology device modules, the plurality of space maintenance modules, and the distribution module being arranged in parallel in a width direction of the first containers; and
a plurality of second containers, having a width identical to or substantially the same as that of the first containers and a length smaller than that of the first containers, that are partitioned into a plurality of power supply modules, a plurality of fire-fighting modules, and at least one passage module, which are arranged in parallel in the width direction on one side of the plurality of first containers respectively, the plurality of power supply modules being arranged corresponding to the plurality of information technology device modules respectively in a length direction of the first containers.

2. The modular data center of claim 1, wherein a respective module corresponds to a respective container equipped with one or more corresponding devices.

3. The modular data center of claim 2, wherein:
a respective information technology device is a respective first container equipped with an information technology device;
a respective maintenance space module is a respective first container whose interior space is not used;
a respective distribution module is a respective first container equipped with an electrical device including a transformer;
a respective power supply module is a respective second container equipped with a power device;
a respective fire-fighting module is a respective second container equipped with a fire-fighting device; and
a respective passage module is a respective second container whose interior space is not used.

4. The modular data center of claim 1, wherein:
each of the plurality of first containers has a first standard size; and
each of the plurality of second containers has a second standard size.

5. The modular data center of claim 1, wherein:
the plurality of fire-fighting modules are arranged corresponding to the plurality of space maintenance modules respectively; and
the passage module is arranged corresponding to the distribution module.

6. The modular data center of claim 1, wherein interior spaces of the plurality of information technology device modules and the plurality of space maintenance modules are connected.

7. The modular data center of claim 1, wherein an air inlet and an air outlet are arranged between the information technology device modules and the power supply modules, the information technology device modules being connected with the power supply modules through the air inlet and the air outlet.

8. The modular data center of claim 1, further comprising a refrigeration unit including:
an air return pipe;
an air supply pipe; and
a plurality of refrigeration modules, the plurality of refrigeration modules being arranged at an interval on the plurality of first containers, one end of the air return pipe being connected to an air return inlet of the plurality of refrigeration modules, the other end being connected to top of the plurality of first containers, one end of the air supply pipe being connected to an air vent of the plurality of refrigeration modules, the other end being connected to bottom of the plurality of first containers, the plurality of refrigeration modules supplying cold air into the plurality of first containers through the air supply pipe and receiving hot air from the plurality of first containers through the air return pipe.

9. The modular data center of claim 8, wherein a respective information technology device module is equipped with a hot air passage and a cold air passage, the hot air passage being arranged on a top of the respective information technology device module and being connected to the air return pipe, the cold air passage being arranged on a bottom of the respective information technology device module and being connected to the air supply pipe.

10. The modular data center of claim 1, wherein the plurality of second containers are further partitioned into a plurality of precision air conditioning modules, the plurality of precision air conditioning modules being arranged in parallel on the other side of the plurality of information technology device modules opposite to the plurality of power supply modules, and corresponding to the plurality of information technology device modules respectively, wherein a respective precision air conditioning modules is equipped with an air vent and an air return inlet, the respective precision air conditioning module supplying cold air into a respective information technology device modules through the air vent and receiving the hot air from the respective information technology device module through the air return inlet.

11. The modular data center of claim 10, wherein:
the respective information technology device module is equipped with a hot air passage and a cold air passage therein, the hot air passage being arranged on a top of the respective information technology device module and being connected to the air return inlet, the cold air passage being arranged on a bottom of the respective information technology device modules and being connected to the air vent.

12. The modular data center of claim 1, wherein:
the plurality of space maintenance modules are arranged in the width direction on two opposite sides of the plurality of information technology device modules respectively, and the distribution module is arranged on the other side of the space maintenance module opposite to the information technology device modules; and
a fire barrier is arranged between the distribution module and the information technology device module.

13. The modular data center of claim 1, further comprising a third container having a width identical to or substantially the same as that of the first containers, and a length between that of the first containers and that of the second containers and equal to two times the width of the first containers, the third container selectively replacing two of the second containers in the plurality of second containers arranged in parallel.

14. The modular data center of claim 13, wherein:
a length of the third container is two times that of the second containers; and
a length of the first containers is two times that of the third container.

* * * * *